(12) United States Patent
Quaife

(10) Patent No.: US 7,432,720 B1
(45) Date of Patent: Oct. 7, 2008

(54) METHOD AND SYSTEM FOR ISOLATED CURRENT AND VOLTAGE MONITORING

(75) Inventor: Philip Richard Quaife, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 11/499,010

(22) Filed: Aug. 4, 2006

(51) Int. Cl.
G01R 31/02 (2006.01)
G01R 31/00 (2006.01)

(52) U.S. Cl. .................................. 324/522; 324/537
(58) Field of Classification Search ............... 324/522, 324/537; 340/652
See application file for complete search history.

(56) References Cited

U.S. PATENT DOCUMENTS

| | | | |
|---|---|---|---|
| 5,491,405 A * | 2/1996 | Schroder-Brumloop et al. | 323/299 |
| 5,598,086 A * | 1/1997 | Somerville | 320/148 |
| 5,747,982 A * | 5/1998 | Dromgoole et al. | 363/21.15 |
| 5,834,973 A * | 11/1998 | Klatser et al. | 330/126 |
| 6,392,859 B1 * | 5/2002 | Ohshima | 361/100 |
| 6,404,609 B1 * | 6/2002 | Mansfield et al. | 361/103 |
| 6,778,664 B1 * | 8/2004 | Price et al. | 379/412 |

OTHER PUBLICATIONS

Matt Smith, "A Chip You Can Use to Monitor Environmental Conditions on PC Motherboard Designs, Analog Dialogue", vol. 33, No. 1, On pp. 44-48, Jan. 1999.
Karrer, N. Hofer-Noser, P., "A new current measuring principle for power electronic applications, Power Semiconductor Devices and ICs", 1999. ISPSD '99. Proceedings., The 11th International Symposium on Publication Date: 1999. On pp. 279-282, Location: Toronto, Ont., Canada.

* cited by examiner

*Primary Examiner*—Vincent Q. Nguyen
*Assistant Examiner*—John Zhu
(74) *Attorney, Agent, or Firm*—Trellis Intellectual Property Law Group, PC

(57) ABSTRACT

An embodiment of the invention provides a method for monitoring electrical characteristic on an electronic circuit board. This electrical characteristic can be voltage or current. The electrical characteristic is measured at a first location. The first location is at a high voltage called primary potential. The electrical characteristic is converted to a proportional frequency. The frequency is sent through an isolation circuit to a second location for monitoring. The second location is at a low voltage called secondary potential. The frequency is provided as input to an environment monitoring circuit at the second location.

20 Claims, 5 Drawing Sheets

METHOD AND SYSTEM FOR ISOLATED CURRENT AND VOLTAGE MONITORING

BACKGROUND OF THE INVENTION

1. Field of Invention

Embodiments of the invention, in general, relate to power measurement on circuit boards and more specifically, the embodiments of the invention relate to isolated current and voltage monitoring.

2. Description of the Background Art

Printed Circuit Boards (PCBs), line cards and electronic assemblies (hereinafter referred to as boards) typically have a power-input section and a digital-circuit section. The power-input section accepts power at a primary DC input voltage termed as a primary potential. The digital-circuit section operates on a relatively small DC voltage termed as a secondary potential. Sections of a board functioning at the primary potential are collectively termed as a primary side. Similarly, various sections functioning at the secondary potential are collectively termed as a secondary side.

The input current is continuously measured and monitored, to prevent any damage or interruption in the digital circuit section on the board. Monitoring can be done in the power input section that controls the switching on or off of the power input and inrush current. For example, monitoring can be performed at an active fuse section, or a hot-swap section. The active fuse section includes an inrush limit Integrated Circuit (IC) or an active fuse IC. The active fuse section is at the primary potential. However, all environment-monitoring functions are referenced to the secondary potential. The environment-monitoring functions include current monitoring, voltage monitoring, temperature monitoring, and so forth.

Safety-approved isolation circuits are used for the transfer of current and voltage from the primary side to the secondary side. Isolation amplifiers can be used for such transfers, but they are relatively expensive and complex. Current shunts, or shunt resistors, used with the isolation amplifiers dissipate heat, leading to inefficiency of the isolation circuit.

DETAILED DESCRIPTION OF EMBODIMENTS OF THE INVENTION

Embodiments of the present invention provide a method and a system for monitoring an electrical characteristic on an electronic circuit board. In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or so forth. In other instances, well-known structures, materials, or operations are not specifically shown or described in detail to avoid obscuring aspects of embodiments of the present invention.

Input power to an electronic circuit board is received at a primary potential point such as at a point that has a high-magnitude input DC voltage. The primary potential point is typically included in an input power section of the board that controls board power (on or off) and inrush current. Input power can be measured at an active fuse or a hot-swap section of the board as a measured electrical characteristic such as current or voltage. The measured electrical characteristic is converted to an intermediate signal such as a proportional frequency, by using a converter circuit such as a current to frequency converter.

The frequency output of the converter is fed as an input to an optocoupler. The optocoupler provides isolation between the primary and the secondary sides of the electronic circuit board. The optocoupler also allows the secondary side (which operates at different potentials from the primary side) to receive the intermediate signal conveying the measured electrical characteristic. The frequency is converted to, or otherwise interpreted as, the original measured electrical characteristic at the secondary side. In this manner a measured electrical characteristic on the primary side can be provided as an input to, e.g., an environment-monitoring circuit on the secondary side.

Figure 1:
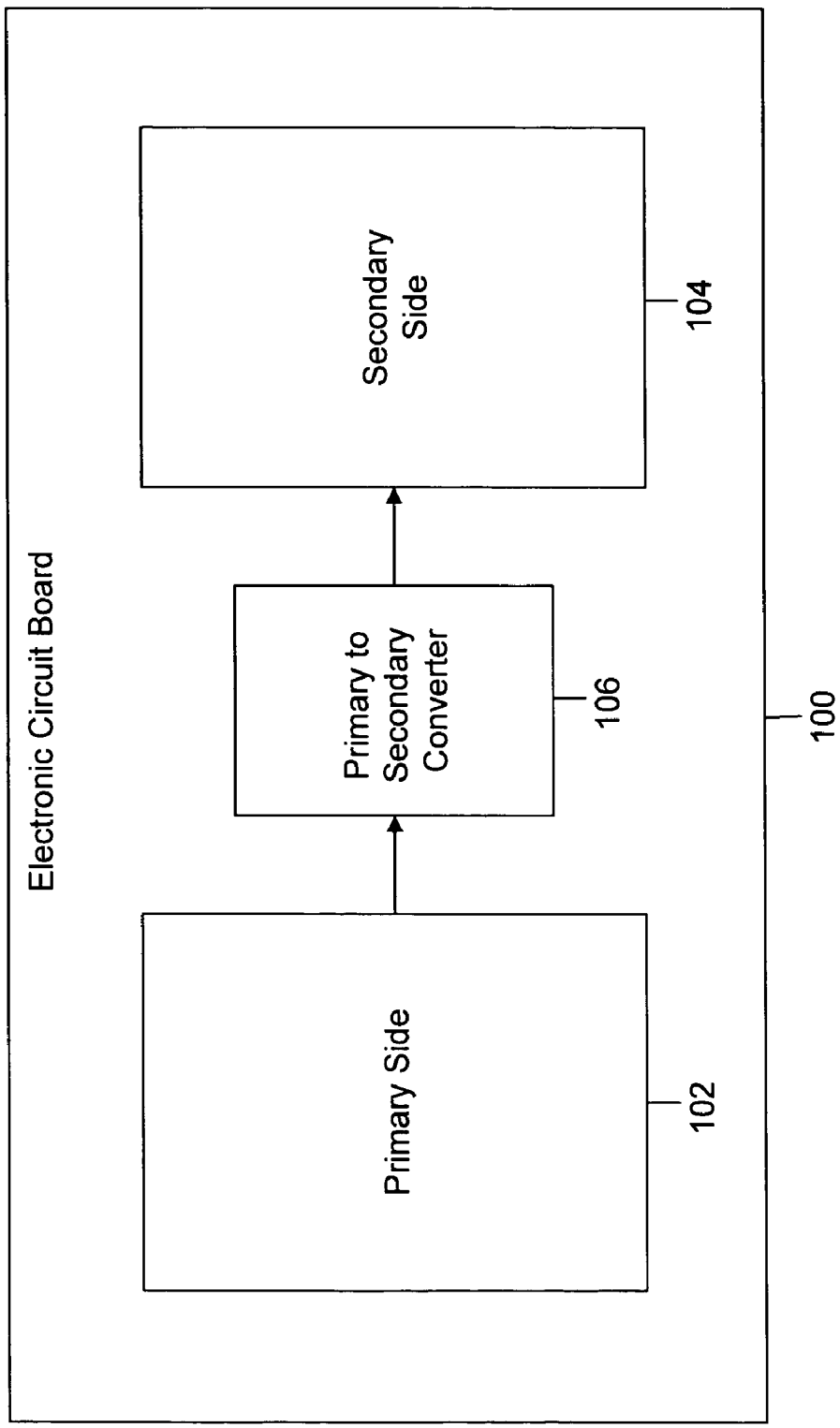
FIG. 1 illustrates an environment for implementing an exemplary embodiment of the present invention.

FIG. 1 shows an environment including electronic circuit board 100. Electronic circuit board 100 includes primary side 102, secondary side 104, and primary-to-secondary converter 106. Examples of electronic circuit board 100 include but are not limited to an electronic board, a line card, an electronic circuit assembly, and so forth. Electronic circuit board 100 includes primary side 102 that receives power supply input at the primary potential. In this embodiment, the primary potential is the DC input voltage. The DC input voltage may be, e.g., 0-60V.

Primary side 102 includes a power control and protection circuit. The power control and protection circuit includes power on-off control, over-current control and over-voltage control circuits. These control circuits act to prevent damage or malfunctioning of components on electronic circuit board 100. Real-time current and voltage, indicative of the input power, are measured in the power control and protection circuit.

After passing through the power control and protection circuit, either one or both of the current and voltage are converted from the primary to the secondary potential and transmitted to secondary side 104. The secondary potential is in the range of 0VDC to 12 VDC. Primary-to-secondary converter 106 may be a DC-DC converter, an AC-DC converter, or other suitable converter depending on the type of the power supply input and electrical characteristic to be measured. The DC-DC converter may be a chopper, a buck-boost converter, etc. The AC-DC converter may be a phase-control rectifier. In general, conversion can be by any suitable circuit or means. The output of primary-to-secondary converter 106 is a power input to secondary side 104 at the secondary potential. Secondary side 104 includes Integrated Chips (ICs) forming digital and environment-monitoring circuitry.

Figure 2:
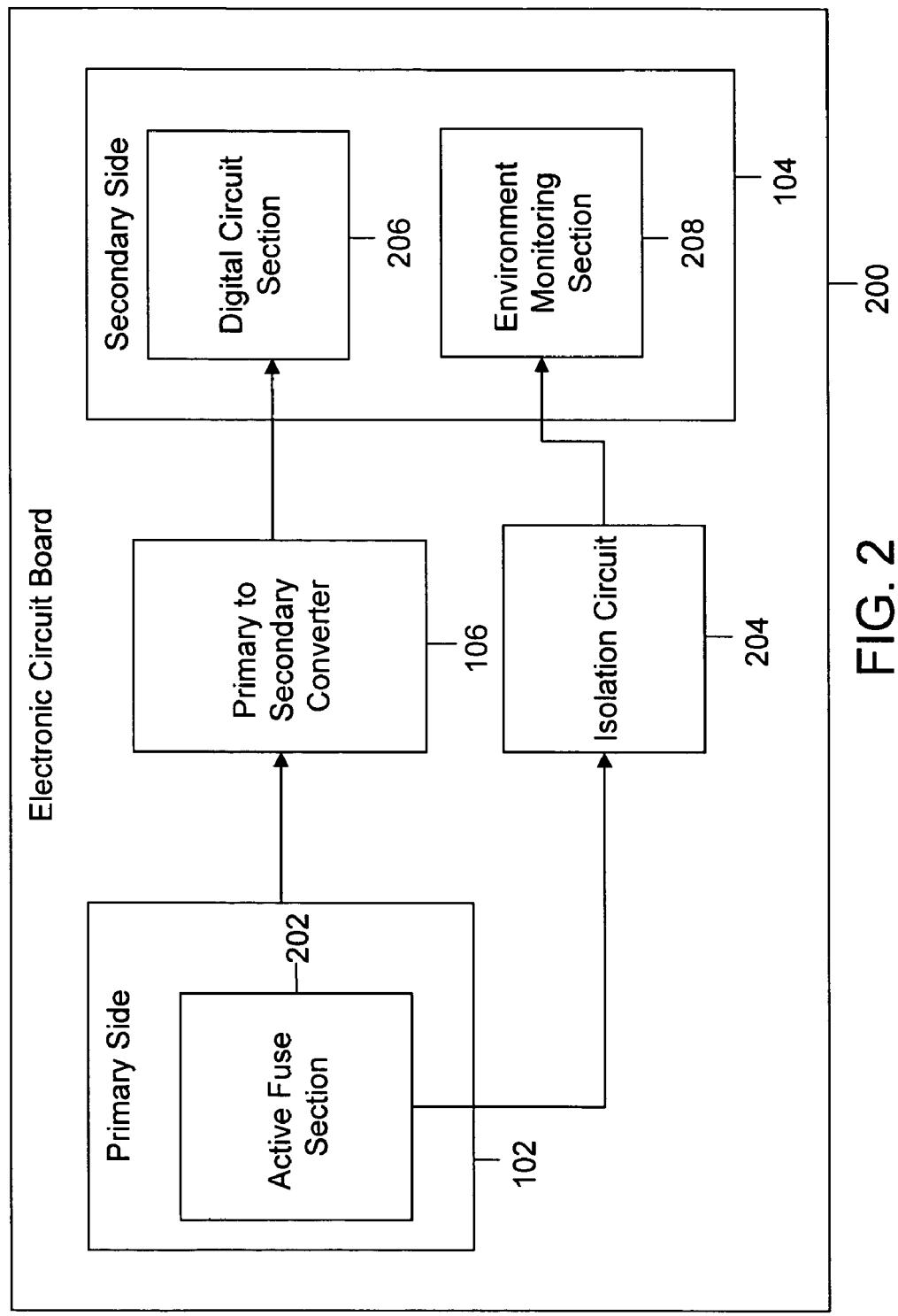
FIG. 2 illustrates an electronic circuit board, in accordance with an exemplary embodiment of the invention.

FIG. 2 illustrates electronic circuit board 200, in accordance with an exemplary embodiment of the invention. Electronic circuit board 200 includes primary side 102, secondary side 104 and primary to secondary converter 106. Primary side 102 includes active-fuse section 202. The current and voltage from active-fuse section 202 is fed as an input to isolation circuit 204. Secondary side 104 includes digital circuit section 206 and environment-monitoring section 208. The output of isolation circuit 204 is fed as an input to environment-monitoring section 208.

Active fuse section 202 includes the power measurement, control and protection circuits of electronic circuit board 200. Active fuse section 202 includes an inrush current IC or an active fuse control IC that limits inrush current to electronic circuit board 200 and acts as an active fuse that turns off the inrush current if an over-current fault occurs. The active fuse IC also measures the power input to electronic circuit board 200. The active fuse control IC includes active fuse logic along with a shunt resistor and a transistor. The shunt resistor is also known as a current shunt.

The active fuse logic includes an arrangement of logic gates that allow only a permissible magnitude of current. The shunt resistor and the transistor assist in limiting the maximum current input to electronic circuit board 200. Real time voltage and current are fed into isolation circuit 204 that transfers the current and voltage from primary side 102 to secondary side 104. Moreover, isolation circuit 204 provides for isolation between the primary potential and the secondary potential. An isolation amplifier typically exemplifies isolation circuit 204. An analog signal is an input for the isolation amplifier.

Digital circuit section 206 performs an intended function of electronic circuit board 200. The intended function may be any electronic task such as connecting one or more subscribers to the Internet, as in a line card. Further, the intended function may be a Voice over Internet Protocol (VoIP) platform, Virtual Private Network (VPN) platform, etc. Digital circuit section 206 includes one or more transistors, logic gates, ICs, etc., which are used to perform the intended function. The transistors, logic gates and ICs are provided with a power input at the secondary potential. The magnitude of the secondary potential is usually based on the type of technology used in the transistors, gates, and ICs, etc. For example, technologies can be Metal Oxide Semiconductor Field Effect Transistors (MOSFETs), Bipolar Junction Transistors (BJTS) and Field Effect Transistors (FETs), etc.

Environment-monitoring section 208 includes one or more environment-monitoring ICs that monitor variables such as current, voltage and temperature. The environment-monitoring ICs include resources such as logic circuits, Random Access Memory (RAM), Read Only Memory (ROM) and a power input. The environment-monitoring ICs are programmed to monitor one or more input variables.

For example, if a frequency is fed as input to environment-monitoring section 208, then the frequency is converted to a proportional, analog or digital, voltage or current signal. Consequently, the current, voltage and power are monitored. The environment-monitoring ICs further generate an interrupt signal, an alarm or a warning, in case a deviation from a set value or a range of values of the variable takes place. For example, the interrupt may be generated due to detection of over current or the battery being low. The environment-monitoring ICs may take a digital input or an analog input depending on the output of the isolation amplifier. In general, analog or digital signals and appropriate circuitry may be used, as desired, to implement features of the invention.

Figure 3:
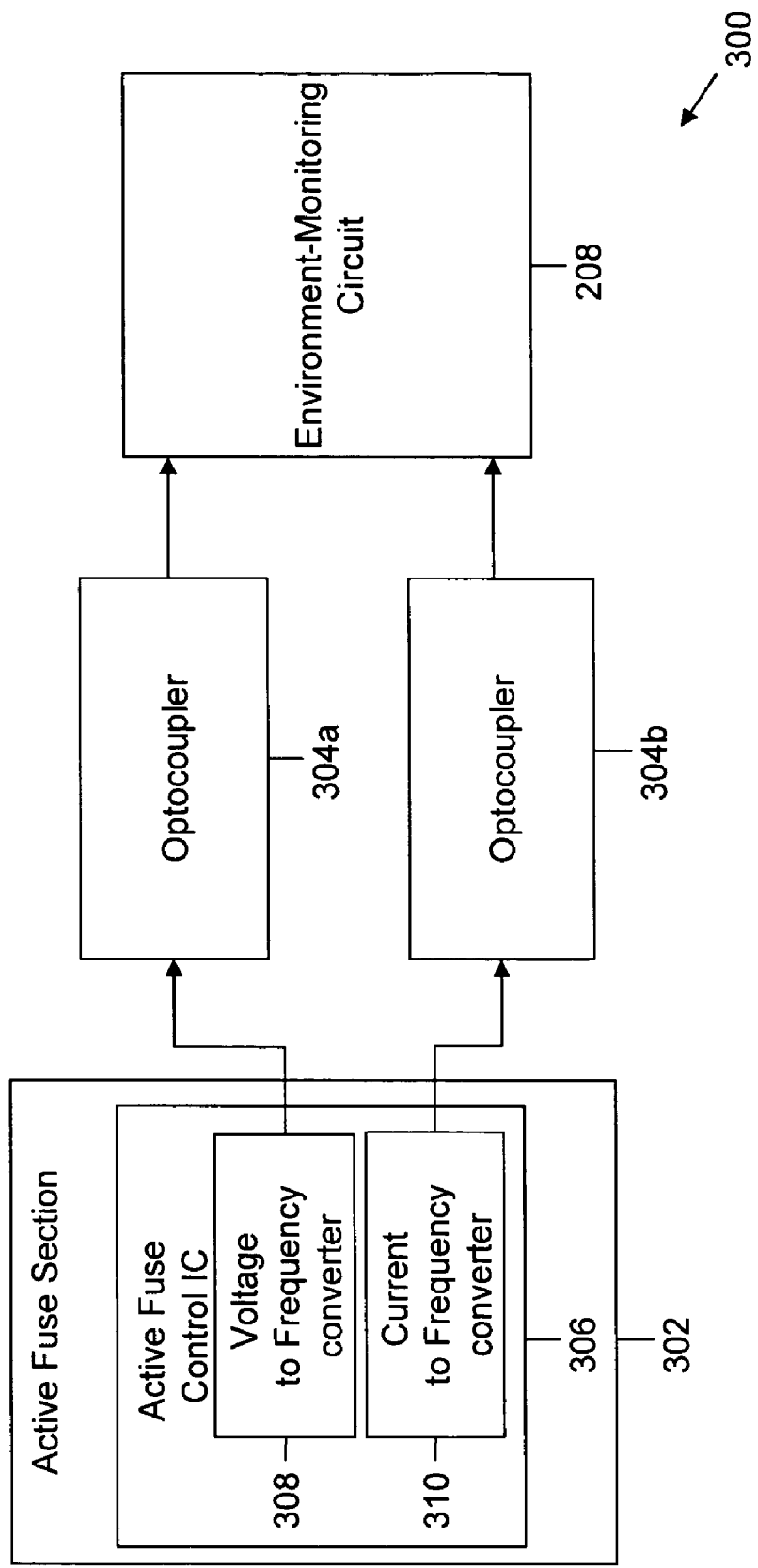
FIG. 3 illustrates a system for monitoring an electrical characteristic on an electronic circuit board, in accordance with an exemplary embodiment of the invention.

FIG. 3 illustrates a system for monitoring an electrical characteristic on an electronic circuit board in accordance with an exemplary embodiment of the invention. Examples of an electrical characteristic include current, voltage and charge. System 300 includes active fuse section 302, optocouplers 304a and 304b, and environment-monitoring circuit 208. Active fuse section 302 includes active fuse control IC 306. Further, active fuse control IC 306 includes voltage-to-frequency converter 308.

In an embodiment of the invention, active fuse control IC 306 also includes current-to-frequency converter 310. Active fuse control IC 306 provides power control and protection to electronic circuit board 200. Active fuse control IC 306 is described in more detail in conjunction with FIG. 4. Real time voltage measured from active fuse control IC 306 is fed as an input to voltage-to-frequency converter 308 and current-to-frequency converter 310. Thereafter, the current and voltage are converted to proportional frequency signals in the voltage-to-frequency converter 308 and current-to-frequency converter 310 respectively.

The frequency signals are fed as input to optocouplers 304a and 304b. Optocouplers 304 are but one type of isolation circuit 204 and other types of isolation circuits or methods can be used. In a preferred embodiment, Optocoupler 304 is a device that uses a short optical transmission path to transfer a signal between elements of a circuit while keeping them electrically isolated. The optical path can be through air or a dielectric waveguide. A common implementation involves a light emitting diode (LED) and a light sensor. The LED and light sensor are activated when an electrical signal is applied to the input of the opto-isolator. A corresponding electrical signal is then generated at the output.

In an embodiment of the invention, frequencies are fed in as inputs and transferred across the isolation barrier by optocouplers 304. The frequencies output by optocouplers 304 are fed as inputs to environment-monitoring circuit 208. If a digital input is used by environment-monitoring circuit 208, the frequencies can be measured directly and fed into environment-monitoring circuit 208. Further, in an embodiment of the invention, the output of optocouplers 304 may be demodulated with passive components such as resistors, inductors and capacitors, to produce analog voltage and current signals proportional to the frequency.

In an embodiment of the invention, frequency-to-current or voltage conversion is provided by a microprocessor or a microcontroller. Other types of processing devices may be used. The analog signals are read by analog to digital (AD) converters. The calibration of AD converters is achieved by proper dimensioning of components of voltage-to-frequency converter 308 and current-to-frequency converter 310. The current and voltage information is continuously provided in real time by active fuse section 302 to electronic circuit board 200 on an uninterrupted basis. Environment-monitoring circuit 208 has access to the information provided by active fuse section 302 at any time for the duration that the system is switched on.

Figure 4:
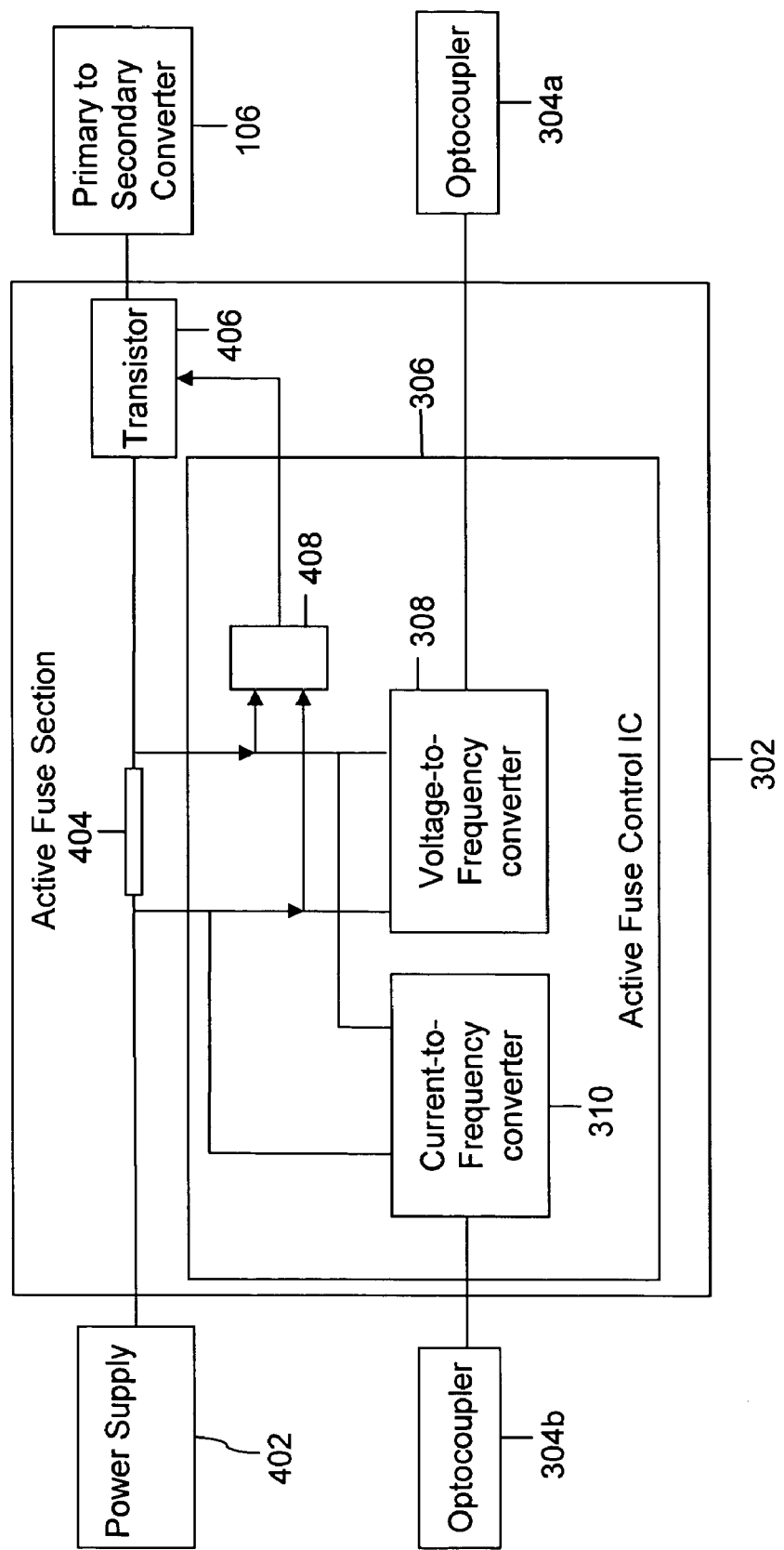
FIG. 4 illustrates an active fuse section, in accordance with an exemplary embodiment of the invention.

FIG. 4 illustrates active fuse section 302, in accordance with an exemplary embodiment of the invention. Active fuse section 302 includes active fuse control IC 306, power supply 402, shunt resistor 404 and transistor 406. Active fuse control IC 306 includes voltage-to-frequency converter 308, current-to-voltage converter 310 and active fuse control logic 408. Power supply 402 is the DC input power source supplying the input power at the primary potential. Active fuse control IC 306 provides short-circuit protection on electronic circuit board 200 with added functionalities of voltage-to-frequency converter 308 and current-to-frequency converter 310.

Active fuse control logic 408 performs the main function of allowing permissible current and turning the system off in case of over current in active fuse control IC 306. Active fuse control logic 408 functions in conjunction with shunt resistor 404 and transistor 406, to prevent current from crossing a threshold limit. Output of active fuse control logic 408 is available as DC input to primary-to-secondary converter 106.

In an embodiment of the invention, the voltage from the input power is measured and made available to voltage-to-frequency converter 308. In another embodiment of the invention, the current from the input power is also measured and made available to current-to-frequency converter 310. The outputs of voltage-to-frequency converter 308 and current-to-frequency converter 310 are the frequencies, which are made available to optocouplers 304.

Figure 5:
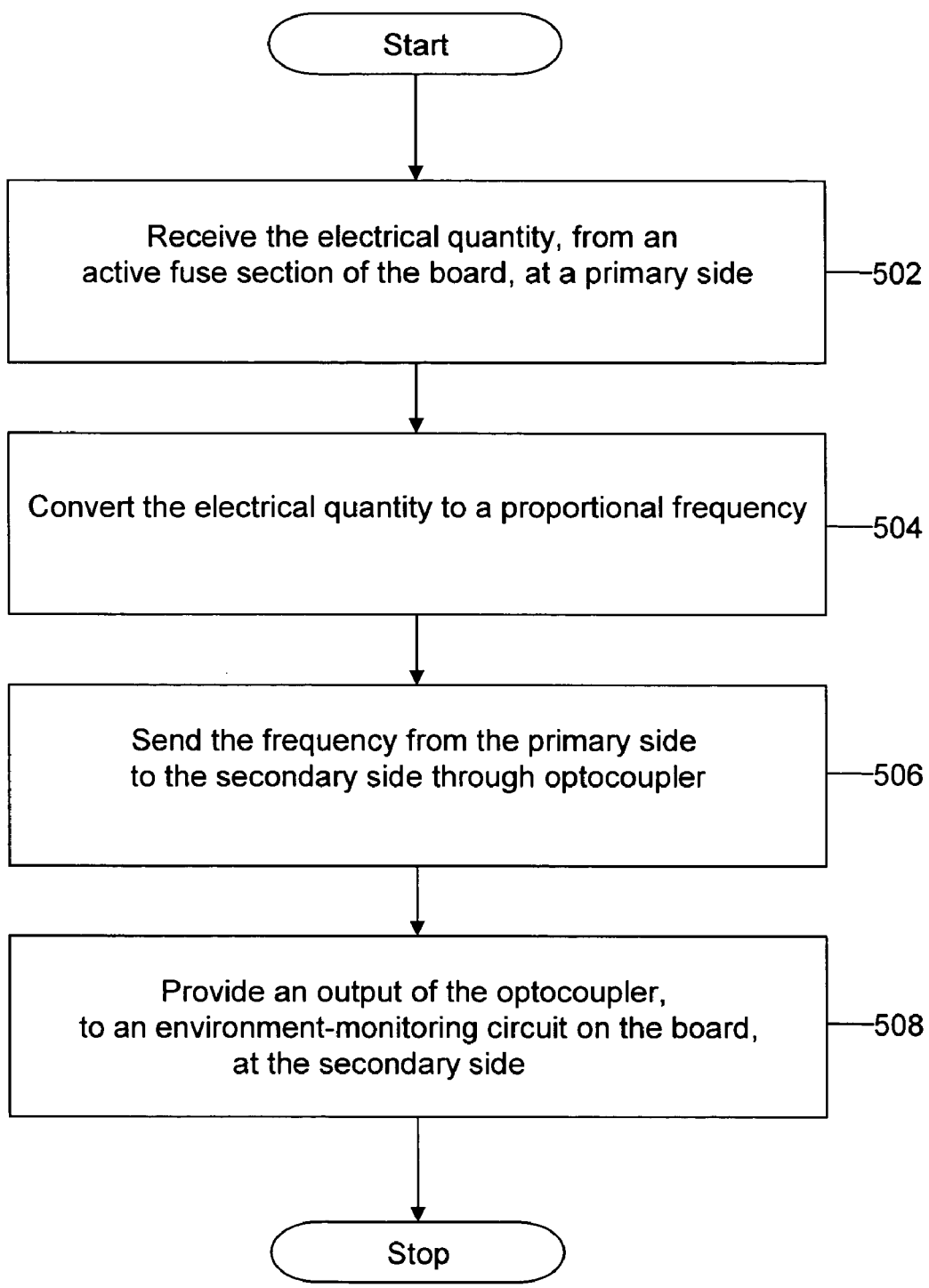
FIG. 5 is a flowchart, illustrating a method for monitoring an electrical characteristic on an electronic circuit board, in accordance with an exemplary embodiment of the invention.

FIG. 5 is a flowchart illustrating a method for monitoring electrical characteristics on an electronic circuit board, in accordance with an exemplary embodiment of the invention. At step 502, an electrical characteristic (i.e., voltage, current, power, charge, etc.) at the primary side is received from active fuse section 302. The electrical characteristic is received at voltage-to-frequency converter 308. In a preferred embodiment, electrical characteristics are used which relate to the power input to electronic circuit board 200. The voltage is received at voltage-to-frequency converter 308 and the current is received at current-to-frequency converter 310. The primary potential is the primary input DC voltage.

At step 504, the electrical characteristic is converted to a proportional frequency by voltage-to-frequency converter 308. In various embodiments of the invention, both the current and the voltage are converted to proportional frequencies. The proportional frequencies indicate the magnitude of the input current and the input voltage. At step 506, the proportional frequencies, are sent from the primary side to the secondary side by optocouplers 304. Optocouplers 304 send the proportional frequency across the isolation barrier. The outputs of optocouplers 304 are frequencies available at the secondary side.

At step 508, the outputs of the optocouplers are provided to environment-monitoring circuit 208. Thereafter, the desired electrical characteristics are monitored by the environment-monitoring circuit and proper functioning of digital circuit section 206 is maintained.

According to various embodiments of the invention, a method for monitoring electrical characteristics on an electronic circuit board is provided. The method comprises receiving the electrical characteristic to be monitored, wherein the electrical characteristic is received at a first location; converting the electrical characteristic to a frequency, wherein the frequency indicates a magnitude of the electrical characteristic; and sending the frequency via an isolation circuit to a second location for monitoring.

In yet another embodiment of the invention, a system for monitoring an electrical characteristic on an electronic circuit board is provided. The system comprises an active fuse logic on the electronic circuit board, the active fuse logic providing the electrical characteristic at a first location; an electrical characteristic-to-frequency converter, the electrical characteristic-to-frequency converter converting the electrical characteristic to a frequency, wherein the frequency is indicative of the electrical characteristic; an optocoupler, the optocoupler sending the frequency from the first location to a second location; and an environment-monitoring circuit, the environment-monitoring circuit monitoring the frequency at the second location.

In yet another embodiment of the invention, an apparatus for monitoring an electrical characteristic on an electronic circuit board is provided. The apparatus comprises means for receiving the electrical characteristic to be monitored, wherein the electric quantity is received at a first potential; means for converting the electrical characteristic to a frequency, wherein the frequency indicates a magnitude of the electrical characteristic; means for sending the frequency from the first location to a second location, and means for monitoring the frequency at the second location.

Although the invention has been discussed with respect to specific embodiments thereof, these embodiments are merely illustrative, and not restrictive, of the invention. All or a part of the functions described herein can be implemented in hardware, software or a combination of both, as feasible and desired.

When implemented with a digital processor, any suitable programming language can be used to implement the routines or functions of the present invention including C, C++, Java, assembly language, etc. Different programming techniques such as procedural or object oriented can be employed. The routines can execute on a single processing device or multiple processors. Although the steps, operations, or computations may be presented in a specific order, this order may be changed in different embodiments. In some embodiments, multiple steps shown sequentially in this specification can be performed at the same time. The sequence of operations described herein can be interrupted, suspended, or otherwise controlled by another process, such as an operating system, kernel, etc. The routines can operate in an operating system environment or as stand-alone routines occupying all, or a substantial part, of the system processing.

A "computer," "microprocessor" or "processor" for purposes of embodiments of the present invention may include any processor-containing device A "computer program" may include any suitable locally or remotely executable program or sequence of coded instructions.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Components of embodiments of the invention may be implemented by using a programmed general-purpose digital computer, application specific integrated circuits (ASICs), programmable logic devices (PLDs), field programmable gate arrays (FPGAs), discrete components, or other suitable components or design approaches. Connections may be wired, wireless, optical, transferred by modem, or any other suitable communication scheme.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A method for monitoring an electrical characteristic on an electronic circuit board, the method comprising:
   receiving the electrical characteristic to be monitored, wherein the electrical characteristic is measured at a power input section operating at a first electrical potential, the power input section transferring a signal associated with the electrical characteristic through a the first DC path to a digital circuit section operating at a second electrical potential in a second location;
   converting the electrical characteristic to a frequency, wherein the frequency indicates a magnitude of the electrical characteristic; and
   sending the frequency via an optocoupler through a second path for monitoring at the second location by an environment-monitoring circuit section, wherein the second location is at a different electrical potential than the power input section, the environmental-monitoring circuit section using the frequency to monitor the electrical characteristic with regard to a function of the digital circuit section operating using the signal received through the first DC path.

2. The method of claim 1, wherein the electrical characteristic includes voltage.

3. The method of claim 1, wherein the electrical characteristic includes current.

4. The method of claim 1, wherein a potential at the first location ranges from 60 to 100 volts.

5. The method of claim 1, wherein a potential at the second location ranges from 0 to 12 volts.

6. The method of claim 1, wherein the electrical characteristic at the second location is in digital form.

7. The method of claim 1, wherein the electrical characteristic at the second location is in analog form.

8. The method of claim 1, further comprising:
   converting the frequency to the electrical characteristic at the second location for monitoring the electrical characteristic.

9. The method of claim 1, wherein the electrical characteristic is monitored in real time.

10. The method of claim 1, wherein sending the frequency via the optocoupler comprises using an optical transmission path to transfer the frequency to the second location while keeping the first location and the second location electrically isolated.

11. The method of claim 1, wherein the optocoupler comprises a light emitting diode or light sensor.

12. A system for monitoring an electrical characteristic on an electronic circuit board, the system comprising:
   an active fuse logic on the electronic circuit board, the active fuse logic providing the electrical characteristic at a first location operating at a first electrical potential, the active fuse logic configured to transfer a signal associated with the electrical characteristic through a first DC path to a digital circuit section operating at a second electrical potential in a second location;
   an electrical characteristic-to-frequency converter, the electrical characteristic-to-frequency converter converting the electrical characteristic to a frequency, wherein the frequency is indicative of a magnitude of the electrical characteristic;
   an optocoupler, the optocoupler sending the frequency through a second path from the first location to a second location for monitoring; and
   an environment-monitoring circuit, the environment-monitoring circuit section monitoring the frequency at the second location, the environmental-monitoring circuit section using the frequency to monitor the electrical characteristic with regard to a function of the digital circuit section operating using the signal received through the first DC path.

13. The system of claim 12, wherein the first location and the second location are on a single integrated circuit.

14. The system of claim 12, wherein the optocoupler is configured to use an optical transmission path to transfer the frequency to the second location while keeping the first location and the second location electrically isolated.

15. The system of claim 12, wherein the environmental-monitoring circuit is configured to convert the frequency to the electrical characteristic at the second location for monitoring the electrical characteristic.

16. The system of claim 12, wherein the optocoupler comprises a light emitting diode or light sensor.

17. An apparatus for monitoring an electrical characteristic on an electronic circuit board, the apparatus comprising:
   means for receiving the electrical characteristic to be monitored, wherein the electrical characteristic is received at a power input section of the electronic circuit board, wherein the power input section is at a first potential, the power input section transferring a signal associated with the electrical characteristic through a first DC path to a digital circuit section operating at a second electrical potential in a second location;
   means for converting the electrical characteristic to a frequency, wherein the frequency indicates a magnitude of the electrical characteristic at the power input section of the electronic circuit board;
   means for sending the frequency to a second location through a second path for monitoring, wherein the frequency is transferred through an optocoupler, wherein the second location is at a second potential, wherein the second potential is an operation potential of digital circuitry that is substantially different from the first potential; and means for monitoring the frequency at the second location to monitor the electrical characteristic with regard to a function of the digital circuit section operating using the signal received through the first DC path.

18. The apparatus of claim 17, wherein the means for sending the frequency via the optocoupler comprises means for using an optical transmission path to transfer the frequency to the second location while keeping the first location and the second location electrically isolated.

19. The apparatus of claim 17, further comprising means for converting the frequency to the electrical characteristic at the second location for monitoring the electrical characteristic.

20. The apparatus of claim 17, wherein the optocoupler comprises a light emitting diode or light sensor.

* * * * *